United States Patent
Lu et al.

(10) Patent No.: US 9,425,735 B2
(45) Date of Patent: *Aug. 23, 2016

(54) VOLTAGE-CONTROLLED OSCILLATOR

(71) Applicant: TAIWAN SEMICONDUCTOR MANUFACTURING CO., LTD., Hsinchu (TW)

(72) Inventors: Ying-Ta Lu, Hsinchu (TW);
Hsien-Yuan Liao, Hsinchu (TW);
Chi-Hsien Lin, Taichung (TW);
Hsiao-Tsung Yen, Tainan (TW);
Ho-Hsiang Chen, Hsinchu (TW);
Chewn-Pu Jou, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/701,175

(22) Filed: Apr. 30, 2015

(65) Prior Publication Data

US 2015/0236644 A1    Aug. 20, 2015

Related U.S. Application Data

(63) Continuation of application No. 13/918,489, filed on Jun. 14, 2013, now Pat. No. 9,041,477.

(51) Int. Cl.
*H03B 5/12*    (2006.01)

(52) U.S. Cl.
CPC .................... *H03B 5/1212* (2013.01)

(58) Field of Classification Search
CPC ....................................... H03B 5/1228

USPC ............................................ 331/117 FE, 167
See application file for complete search history.

(56) References Cited

U.S. PATENT DOCUMENTS

| | | | |
|---|---|---|---|
| 7,920,030 B2 | 4/2011 | Jang et al. | |
| 8,264,293 B2 | 9/2012 | Yun et al. | |
| 8,593,232 B2 | 11/2013 | Chataigner | |
| 2011/0148535 A1 | 6/2011 | Lee | |

OTHER PUBLICATIONS

Ahmed H. Mostafa, et al., "A CMOS VCO Architecture Suitable for Sub-1 Volt High-Frequency (8.7-10 GHz) RF Applications", Microelectronics and Computer Systems Laboratory, McGill University, 3480 University Street, Montreal, Quebec, Canada H3A 2A7, Aug. 6-7, 2001, Hunginton Beach, CA, USA. 2001 ACM 1-58113-371-5/01/008, pp. 247-250.

*Primary Examiner* — Joseph Chang
(74) *Attorney, Agent, or Firm* — McDermott Will & Emery LLP

(57) ABSTRACT

An apparatus is disclosed that includes a first cross-coupled transistor pair, a second cross-coupled transistor pair, at least one capacitance unit, and a first, second, third, and fourth inductive elements. The first cross-coupled transistor pair and second cross-coupled transistor pair are coupled to a pair of first output nodes and a pair of second output nodes, respectively. The at least one capacitance unit is coupled to at least one of the pair of first output nodes and the pair of second output nodes. The first and second inductive elements are electrically coupled to the first output nodes, respectively. The third inductive element is electrically coupled to one of the second output nodes and DC-biased and magnetically coupled to the first inductive element. The fourth inductive element is electrically coupled to the other of the second output nodes and DC-biased and magnetically coupled to the second inductive element.

20 Claims, 10 Drawing Sheets

VOLTAGE-CONTROLLED OSCILLATOR

PRIORITY CLAIM AND CROSS-REFERENCE

This application is a continuation of U.S. Non-Provisional application Ser. No. 13/918,489, filed Jun. 14, 2013, which is incorporated herein by reference in its entirety.

FIELD

The present disclosure relates to integrated circuits, and more particularly, to voltage-controlled oscillators.

BACKGROUND

Voltage-controlled oscillator (VCO) typically generates a signal having an oscillation frequency determined by a control signal. To save power in electronics devices such as portable devices, VCO is increasingly designed to operate with power supply having a lower voltage level.

In an approach, a VCO including NMOS transistors, PMOS transistors and a current source is provided. However, the VCO requires a large voltage headroom consisting of an NMOS threshold voltage, a PMOS threshold voltage, and a saturation voltage of the current source. As a result, the voltage headroom cannot be reduced when a lower supply voltage is used for the VCO.

Conversely, in another approach, an NMOS or PMOS VCO is provided and is able to have a reduced voltage headroom. However, it has worse performance such as poor phase noise performance.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
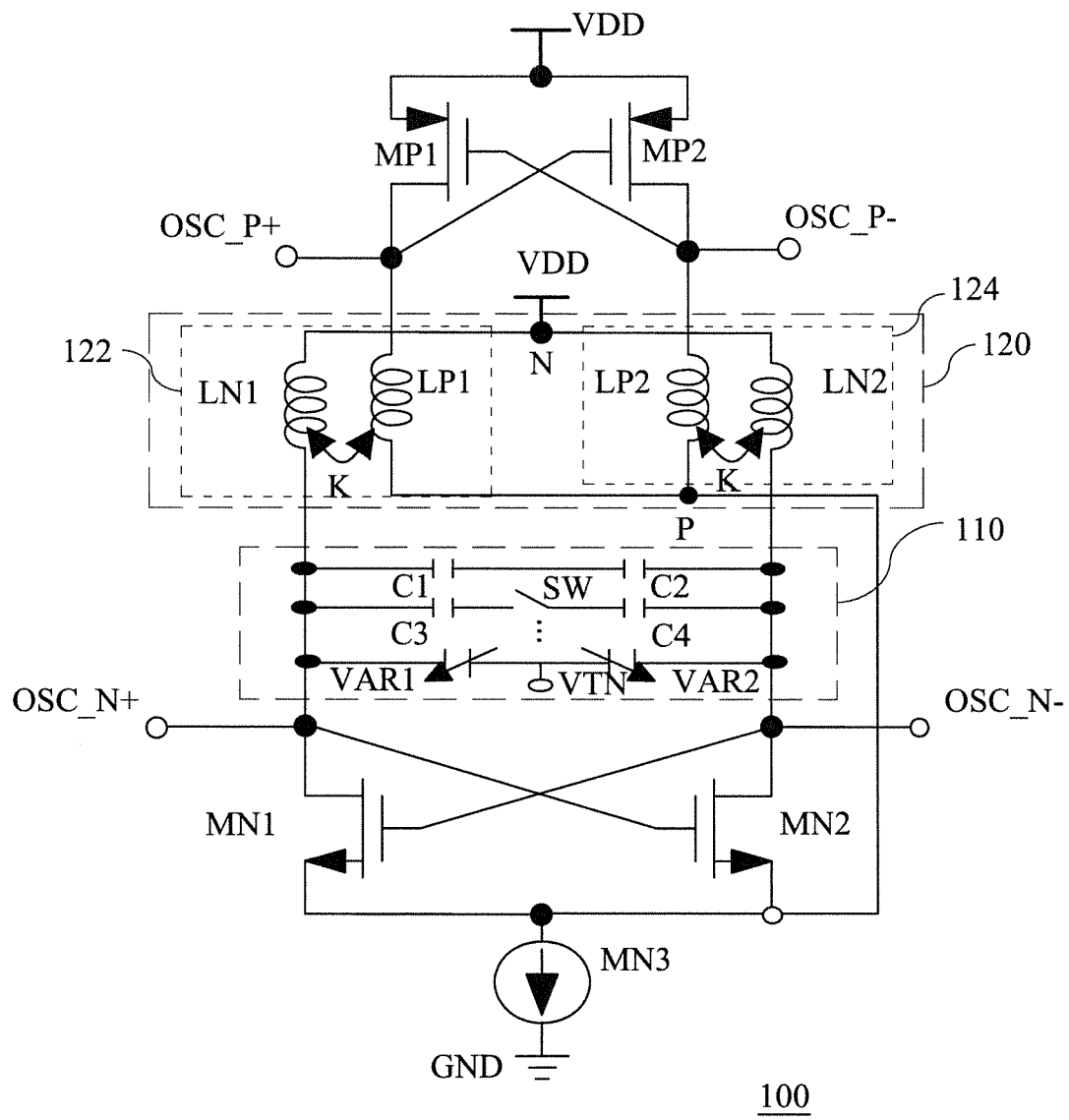
FIG. 1 is a schematic diagram of a CMOS VCO in accordance with some embodiments of the present disclosure.

FIG. 1 is a schematic diagram of a CMOS VCO 100 in accordance with some embodiments of the present disclosure.

A capacitance unit 110 and an inductive unit 120 are provided and operate as an LC resonator. PMOS cross-coupled transistors MP1 and MP2, the capacitance unit 110 and the inductive unit 120 operate as a PMOS cross-coupled VCO that generates signals having controlled oscillation frequency at output nodes OSC_P+ and OSC_P−. NMOS cross-coupled transistors MN1 and MN2, the capacitance unit 110 and the inductive unit 120 operate as an NMOS cross-coupled VCO that generates signals having controlled oscillation frequency at output nodes OSC_N+ and OSC_N−.

The drains of MP1 and MP2 are coupled to the output nodes OSC_P+ and OSC_P−, respectively. The gate of MP1 is coupled to the drain of MP2. The gate of MP2 is coupled to the drain of MP1. The sources of MP1 and MP2 are coupled to a power supply voltage VDD. The drains of MN1 and MN2 are coupled to output nodes OSC_N+ and OSC_N−, respectively. The gate of MN1 is coupled to the drain of MN2. The gate of MN2 is coupled to the drain of MN1. The sources of MN1 and MN2 are coupled to a current source MN3. For this illustration, the current source MN3 provides a constant current in the CMOS VCO 100. In some embodiments, the current source MN3 is implemented by an NMOS transistor.

The inductive unit 120 is coupled to MP1 and MP2 at the output nodes OSC_P+ and OSC_P−, and is coupled to MN1 and MN2 at the output nodes OSC_N+ and OSC_N−. The inductive unit 120 functions as the inductive load of the PMOS VCO and the NMOS VCO. The inductive unit 120 operates to generate mutual magnetic coupling between the output nodes OSC_P+ and OSC_N+ and between the output nodes OSC_P− and OSC_N−.

The inductive unit 120 includes inductive elements such as inductors LN1, LN2, LP1 and LP2. The inductor LN1 is coupled between the output node OSC_N+ and the power supply voltage VDD. The inductor LN2 is coupled between the output node OSC_N− and the power supply voltage VDD. The inductor LP1 is coupled between the output node OSC_P+ and the current source MN3. The inductor LP2 is coupled between the output node OSC_P− and the current source MN3.

The inductors LN1 and LP1 are magnetically coupled to each other with a coupling coefficient K. The inductors LN2 and LP2 are magnetically coupled to each other with the same coupling coefficient K. In some embodiments, the coupling coefficient K is in the range of 0.6-0.9. The values of K are given for illustrative purposes. Other values of K are within the contemplated scope of the present disclosure.

In some embodiments, a transformer 122 including the inductors LN1 and LP1 is provided in the inductive unit 120, while the inductors LN2 and LP2 are individually provided. In other embodiments, a transformer 124 including the inductors LN2 and LP2 is provided in the inductive unit 120, while the inductors LN1 and LP1 are individually provided. Both of the transformers 122 and 124 that are provided in the inductive unit 120 are within the contemplated scope of the present disclosure.

The capacitance unit 110 together with the inductors LP1, LP2, LN1 and LN2 operate as one LC resonator. This LC resonator is configured to work in the NMOS cross-coupled VCO. The tuning of the LC resonator is performed by tuning the capacitance of the capacitance unit 110.

The capacitance unit 110 is coupled to the output nodes OSC_N+ and OSC_N−, and includes capacitors C1-C4, a switch SW, and varactors VAR1 and VAR2. The capacitors C1 and C2 are coupled in series between the output nodes OSC_N+ and OSC_N−. The switch SW is coupled between the capacitors C3 and C4. The switch SW together with the capacitors C3 and C4 are coupled between the output nodes OSC_N+ and OSC_N−. The varactors VAR1 and VAR2 are coupled in series between the output nodes OSC_N+ and OSC_N−.

In some embodiments, each of the capacitors C1 and C2 has a fixed capacitance value. The switch SW is turned on or turned off for a coarse oscillation frequency tuning of the signals at the output nodes OSC_P+, OSC_P−, OSC_N+ and OSC_N−. The varactors VAR1 and VAR2 are analog-voltage controlled for a fine oscillation frequency tuning of the signals at the output nodes OSC_P+, OSC_P−, OSC_N+ and OSC_N−.

The number of capacitors and varactors in FIG. 1 is given for illustrative purposes. Other numbers and configurations of capacitors and varactors are within the contemplated scope of the present disclosure. For example, the varactor VAR1 and/or VAR2 are replaced by a plurality of switchable capacitors.

A terminal VTN between the varactors VAR1 and VAR2 is configured as a voltage control terminal. By applying different voltages at the voltage control terminal VTN, the capacitance of each of the varactors VAR1 and VAR2 changes accordingly. In some embodiments, a voltage ranging from 0 V to the power supply voltage VDD is applied at the voltage control terminal VTN.

In operation, the inductors LN1 and LP1 have mutual magnetic coupling therebetween, such that the output nodes OSC_P+ and OSC_N+ are magnetically coupled to each other. Similarly, the inductors LN2 and LP2 have mutual magnetic coupling therebetween, such that the output nodes OSC_P− and OSC_N− are magnetically coupled to each other. As a result, feedback oscillation is generated between the PMOS cross-coupled VCO and the NMOS cross-coupled VCO, such that a coherent and stable oscillation is sustained for the CMOS VCO 100.

Figure 2A:
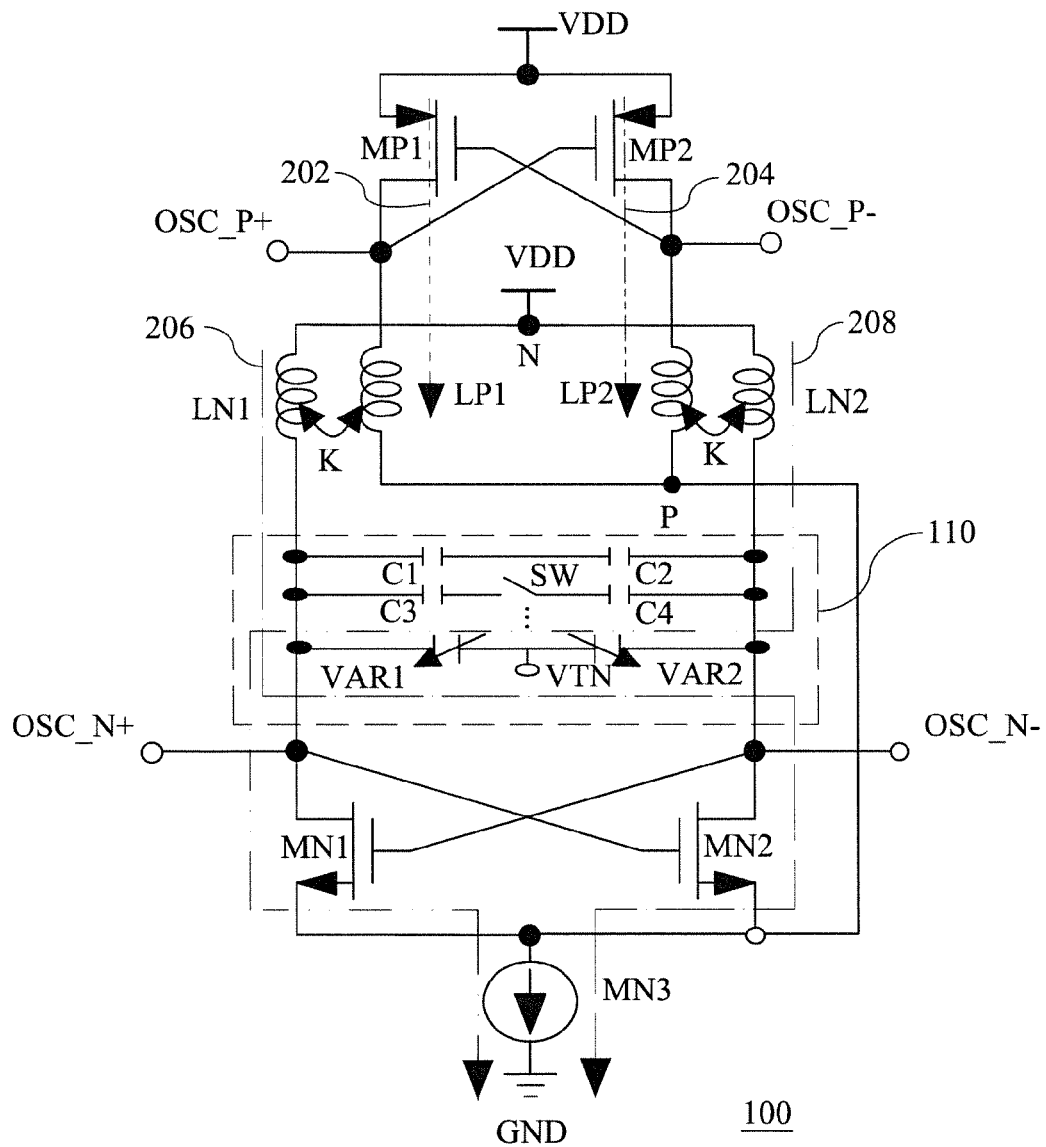
FIG. 2A is a schematic diagram illustrating operations of the CMOS VCO, in accordance with some embodiments of the present disclosure.
Figure 2B:
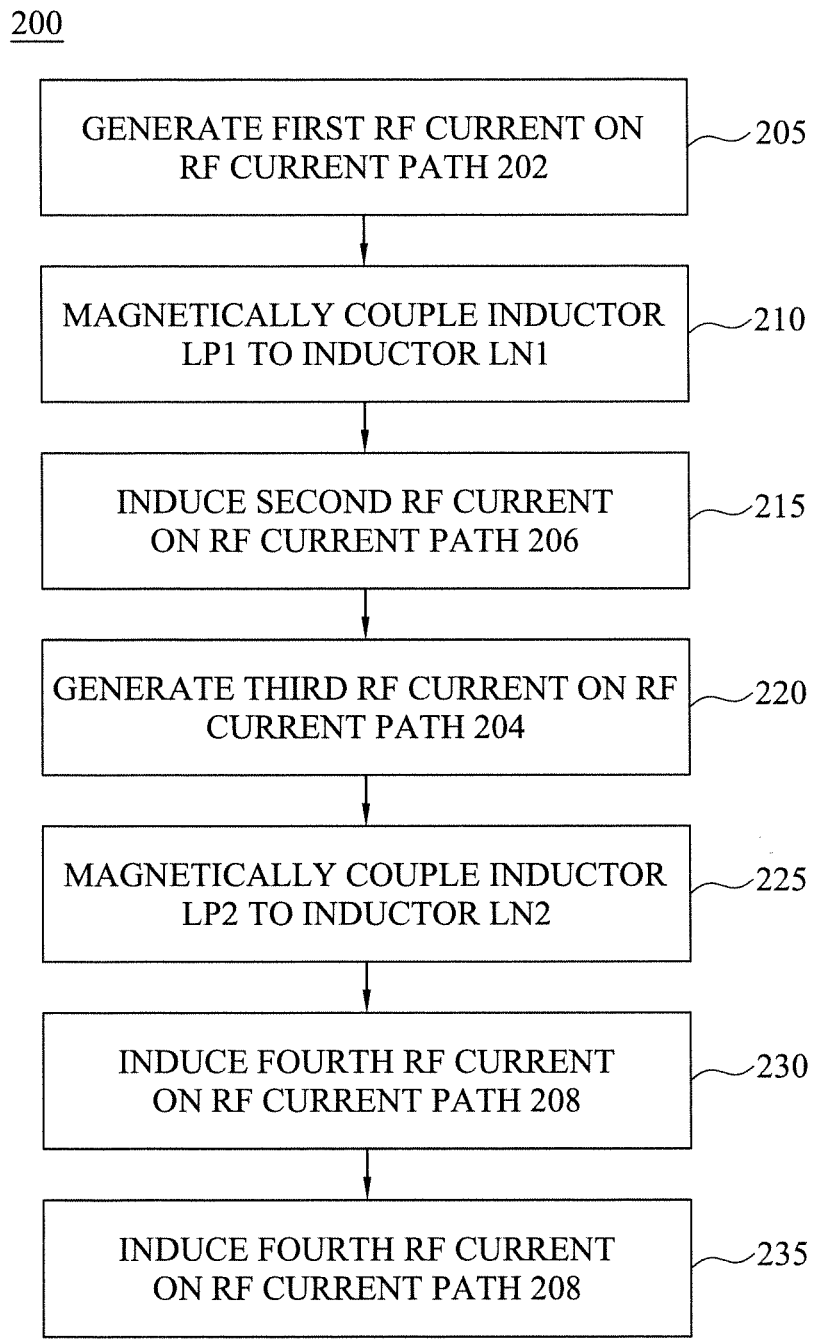
FIG. 2B is a flow chart of a method illustrating operations of the CMOS VCO, in accordance with some embodiments of the present disclosure.

FIG. 2A is a schematic diagram illustrating operations of the CMOS VCO 100, in accordance with some embodiments of the present disclosure. FIG. 2B is a flow chart of a method 200 illustrating operations of the CMOS VCO 100, in accordance with some embodiments of the present disclosure.

For illustration, FIG. 2A is used to illustrate the RF operations of the CMOS VCO 100. Various operations in FIG. 2B correspond to the RF operations illustratively shown in FIG. 2A. In the RF operations of the CMOS VCO 100, RF currents corresponding to the RF operations are generated, and are described below.

In operation 205, a first RF current is generated on an RF current path 202, flowing from MP1 to LP1.

In operation 210, the inductor LP1 is magnetically coupled to the inductor LN1.

In operation 215, a second RF current is induced and flows on an RF current path 206 due to the magnetically coupled LN1 and LP1. The second RF current on the current path 206 flows from LN1 through the capacitance unit 110, MN2, and MN3.

In operation 220, a third RF current is generated on an RF current path 204, flowing from MP2 to LP2.

In operation 225, the inductor LP2 is magnetically coupled to the inductor LN2.

In operation 230, a fourth RF current is induced and flows on an RF current path 208 due to the magnetically coupled LN2 and LP2. The fourth RF current on the current path 208 flows from LN2 through the capacitance unit 110, MN1, and MN3.

In operation 235, oscillation signals corresponding to the RF operations are generated at the output nodes OSC_P+, OSC_P−, OSC_N+, and OSC_N−.

In the RF operations of the CMOS VCO 100, the transistors MP1 and MP2, the capacitance unit 110, and the inductors LN1, LN2, LP1 and LP2 together operate as the PMOS cross-coupled VCO. Similarly, the transistors MN1 and MN2, the capacitance unit 110, and the inductors LN1, LN2, LP1 and LP2 together operate as the NMOS cross-coupled VCO. Due to the complementary NMOS and PMOS cross-coupled VCOs, the CMOS VCO 100 has good performance such as low phase noise. The noise up-conversion of the CMOS VCO 100 is thus suppressed because of the low phase noise.

In some embodiments, the oscillation frequency of the oscillation signals is controlled by the capacitance unit 110. Specifically, when the switch SW in the capacitance unit 110 is turned on or turned off, a coarse oscillation frequency of the oscillation signals is tuned accordingly. Furthermore, when the varactors VAR1 and VAR2 are controlled by analog voltages, a fine oscillation frequency of the oscillation signals is tuned accordingly.

Figure 3A:
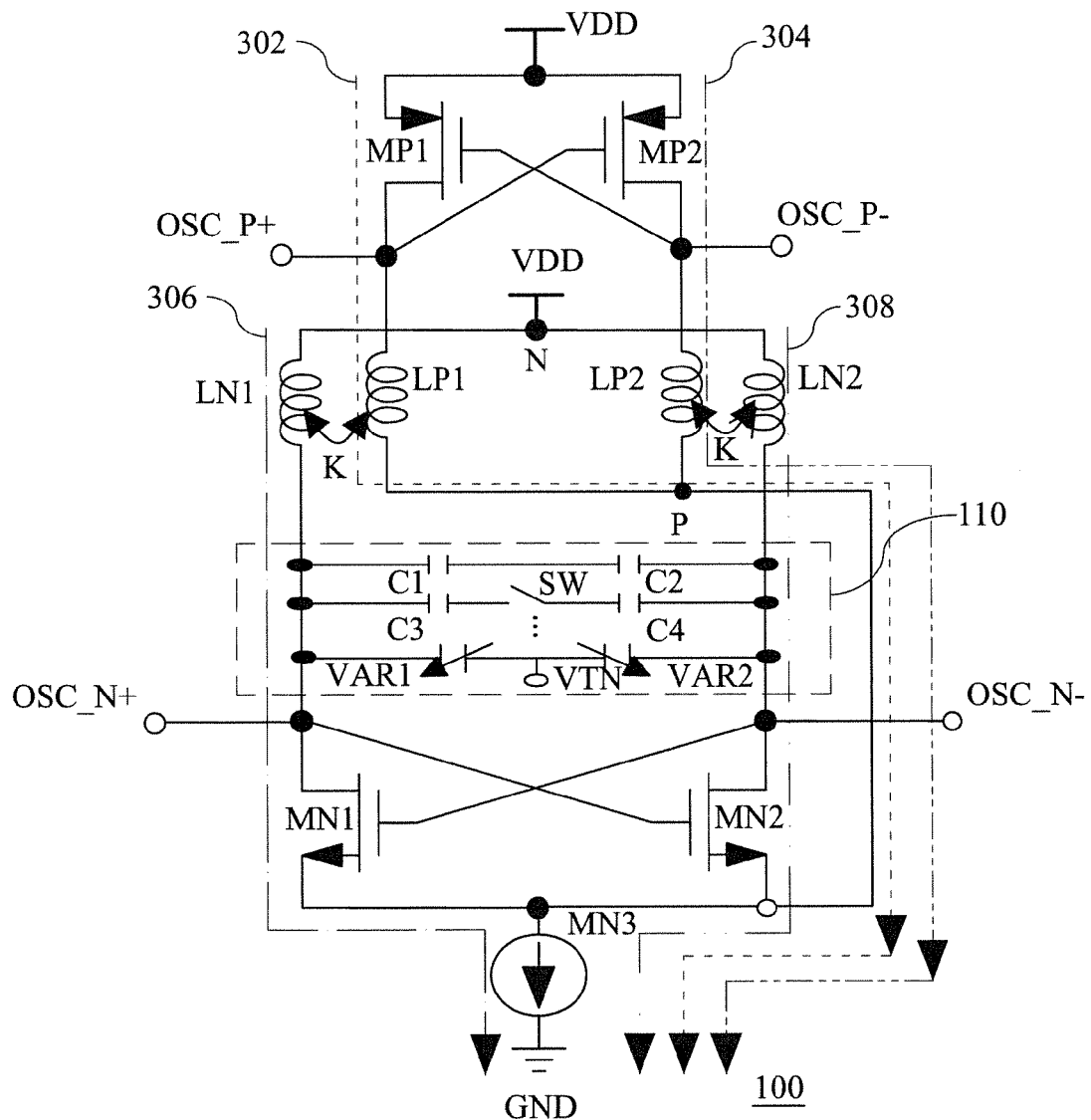
FIG. 3A is a schematic diagram illustrating operations of the CMOS VCO, in accordance with some other embodiments of the present disclosure.
Figure 3B:
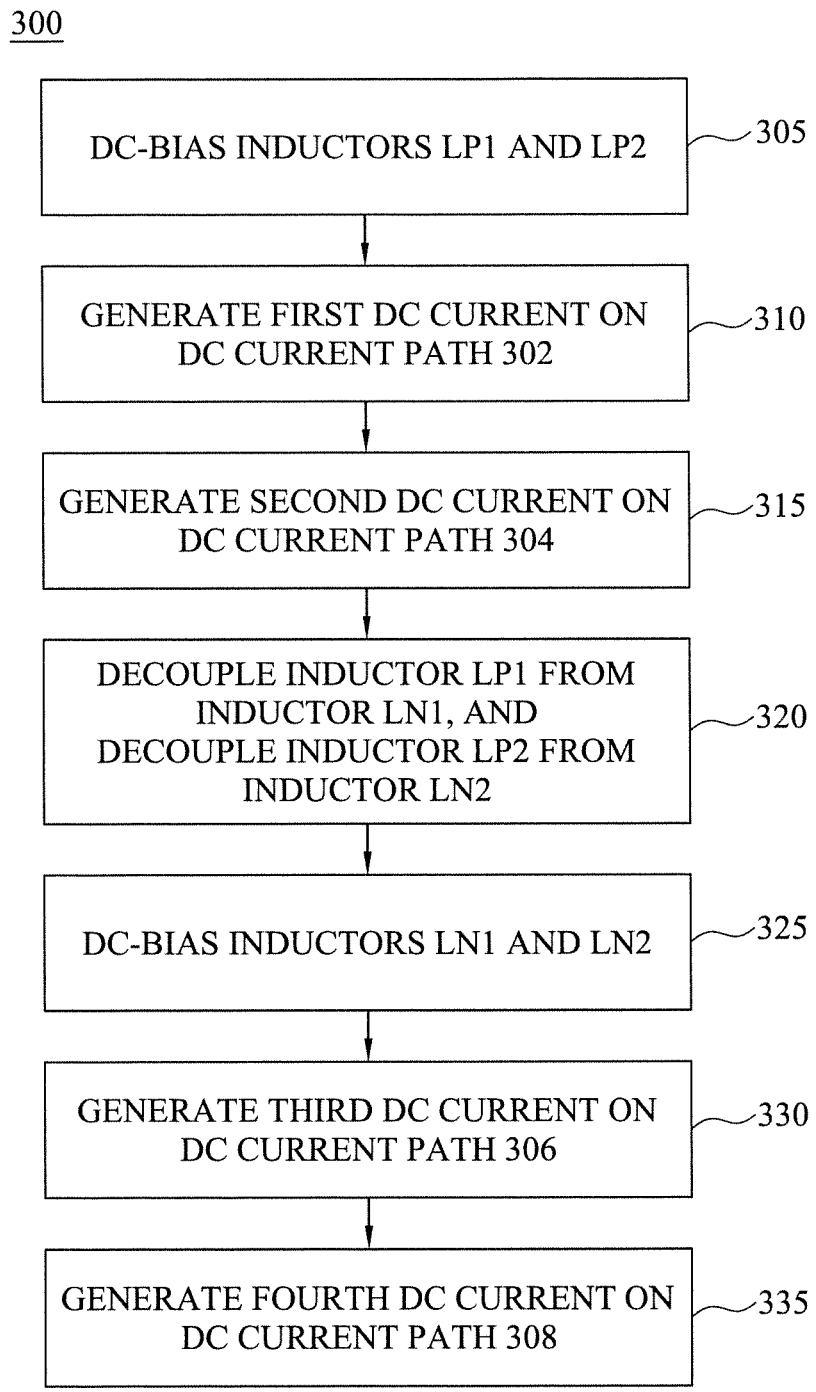
FIG. 3B is a flow chart of a method illustrating operations of the CMOS VCO, in accordance with some other embodiments of the present disclosure.

FIG. 3A is a schematic diagram illustrating operations of the CMOS VCO 100, in accordance with some other embodiments of the present disclosure. FIG. 3B is a flow chart of a method 300 illustrating operations of the CMOS VCO 100, in accordance with some other embodiments of the present disclosure.

For illustration, FIG. 3A is used to illustrate the DC operations of the CMOS VCO 100. Various operations in FIG. 3B correspond to the DC operations illustratively shown in FIG.

3A. In the DC operations of the CMOS VCO 100, DC currents corresponding to the DC operations are generated, and are described below.

In operation 305, the inductors LP1 and LP2 are DC-biased by the power supply voltage VDD at the node P. As a result, the node P provides a DC-feeding path for biasing the PMOS cross-coupled VCO.

In operation 310, a first DC current is generated and flows on a DC current path 302. The first DC current on the DC current path 302 flows through MP1, LP1, and MN3 in the DC operation of the PMOS cross-coupled VCO.

In operation 315, a second DC current is generated and flows on a DC current path 304. The second DC current on the current path 304 flows through MP2, LP2, and MN3 in the DC operation of the PMOS cross-coupled VCO.

In operation 320, the inductor LP1 is decoupled from the inductor LN1, and the inductor LP2 is decoupled from the inductor LN2.

In operation 325, the inductors LN1 and LN2 are DC-biased by the power supply voltage VDD at the node N. As a result, the node N provides a DC-feeding path for biasing the NMOS cross-coupled VCO.

In operation 330, a third DC current is generated and flows on a DC current path 306. The third DC current on the DC current path 306 flows through LN1, MN1, and MN3 in the DC operation of the NMOS cross-coupled VCO.

In operation 335, a fourth DC current is generated and flows on a DC current path 308. The fourth DC current on the current path 308 flows through LN2, MN2, and MN3 in the DC operation of the NMOS cross-coupled VCO.

For illustration in FIG. 3A, the current source MN3 provides the DC currents flowing through the transistors MP1 and MP2 and the inductors LP1 and LP2. The current source MN3 also provides the DC currents flowing through the inductors LN1 and LN2 and the transistors MN1 and MN2.

In the DC operation of the CMOS VCO 100, the inductors LN1 and LP1 are decoupled from each other, and the inductors LN2 and LP2 are decoupled from each other. As a result, the currents flowing through corresponding LP1 and LN1 are each individual due to the decoupled LN1 and LP1, and the currents flowing through corresponding LP2 and LN2 are each individual due to the decoupled LN2 and LP2. Alternatively stated, the DC biasing operations of the two VCOs are performed separately.

For simplicity, a threshold voltage of a PMOS transistor including that of MP1 and MP2 is called Vthp, and a threshold voltage of an NMOS transistor including that of MN1 and MN2 is called Vthn. A voltage headroom indicates a circuit's supply voltage available for use by the circuit. When the DC current path 202 is conducted, the voltage headroom of the CMOS VCO 100 includes a sum of a threshold voltage Vthp of MP1 and a saturation voltage Vsat of the current source MN3. Similarly, when the DC current path 204 is conducted, the voltage headroom includes a sum of a threshold voltage Vthp of MP2 and the saturation voltage Vsat of the current source MN3.

Further, with reference to the DC current path 206, the voltage headroom includes a sum of the threshold voltage Vthn of MN1 and the saturation voltage Vsat of the current source MN3. Similarly, with reference to the DC current path 208, the voltage headroom includes a sum of the threshold voltage Vthn of MN2 and the saturation voltage Vsat of the current source MN3.

As a result, the voltage headroom of the CMOS VCO 100 is reduced in comparison with the voltage headroom of other CMOS VCOs in other approaches that includes corresponding Vthp, Vthn and Vsat. For illustration, the power supply voltage VDD is about 1 V. In some embodiments of the present disclosure, the sum of Vthp and Vsat or the sum of Vthn and Vsat is less than 1 V, and the CMOS VCO 100 continues to operate at 1 V or less. In contrast, in the other approaches, the sum of Vthp, Vthn and Vsat could be greater than 1 V, and thus the corresponding VCO ceases to function because the power supply voltage VDD is not sufficient for the operation of the corresponding VCO. Alternatively stated, in the other approaches, the power supply voltage VDD has to be higher than 1 V.

As described above, the CMOS VCO 100 of the present disclosure can operate with a lower power supply voltage VDD of less than 1 V. Because the CMOS VCO 100 can operate with a lower power supply voltage, less power consumption is required to sustain the operation of the CMOS VCO 100 of the present disclosure.

Figure 4:
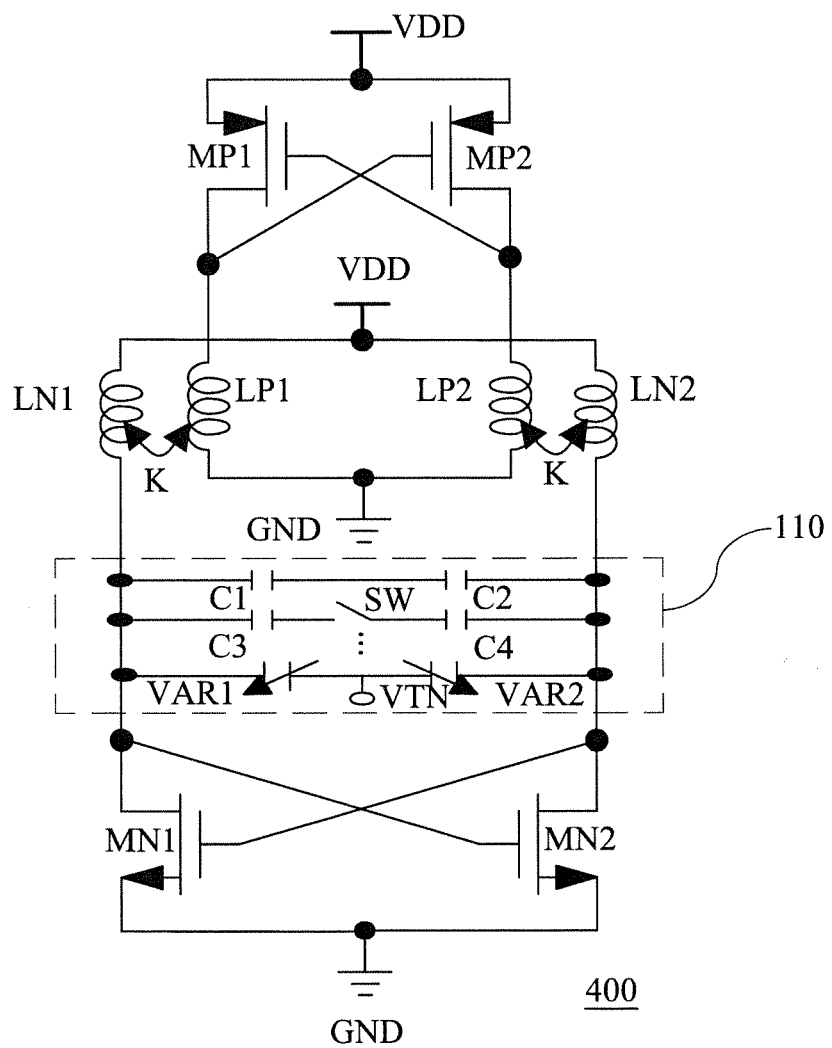
FIG. 4 is a schematic diagram of a CMOS VCO in accordance with some other embodiments of the present disclosure.

FIG. 4 is a schematic diagram of a CMOS VCO 400 in accordance with some other embodiments of the present disclosure.

Compared with the CMOS VCO 100 in FIG. 1, the CMOS VCO 400 includes no current source MN3. Except for the current source MN3 providing the constant current in FIG. 1, the operation of the CMOS VCO 400 is similar to that of the CMOS VCO 100.

Figure 5:
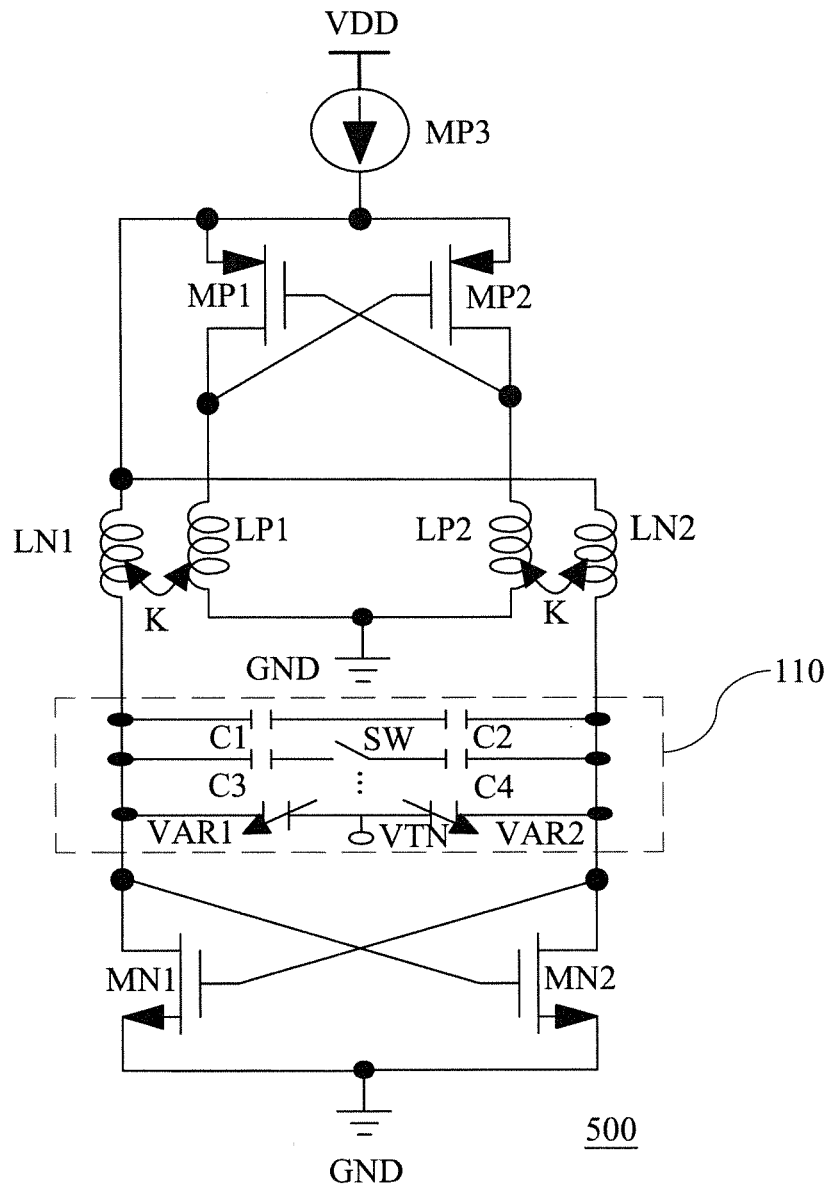
FIG. 5 is a schematic diagram of a CMOS VCO in accordance with some further embodiments of the present disclosure.

FIG. 5 is a schematic diagram of a CMOS VCO 500 in accordance with some further embodiments of the present disclosure.

Compared with the CMOS VCO 100 in FIG. 1, the CMOS VCO 500 does not include the current source MN3, but includes a current source MP3. The current source MP3 is coupled between the power supply voltage VDD and the sources of MP1 and MP2. The current source MP3 is also coupled to the inductors LN1 and LN2. The current source MP3 provides a constant current flowing through the circuit components in the CMOS VCO 500 to the ground GND. For example, the current source MP3 provides the DC currents flowing through the transistors MP1 and MP2 and the inductors LP1 and LP2 to the ground GND. The current source MP3 also provides the DC currents flowing through the inductors LN1 and LN2 and the transistors MN1 and MN2 to the ground GND. In some embodiments, the current source MP3 is implemented by a PMOS transistor.

Figure 6:
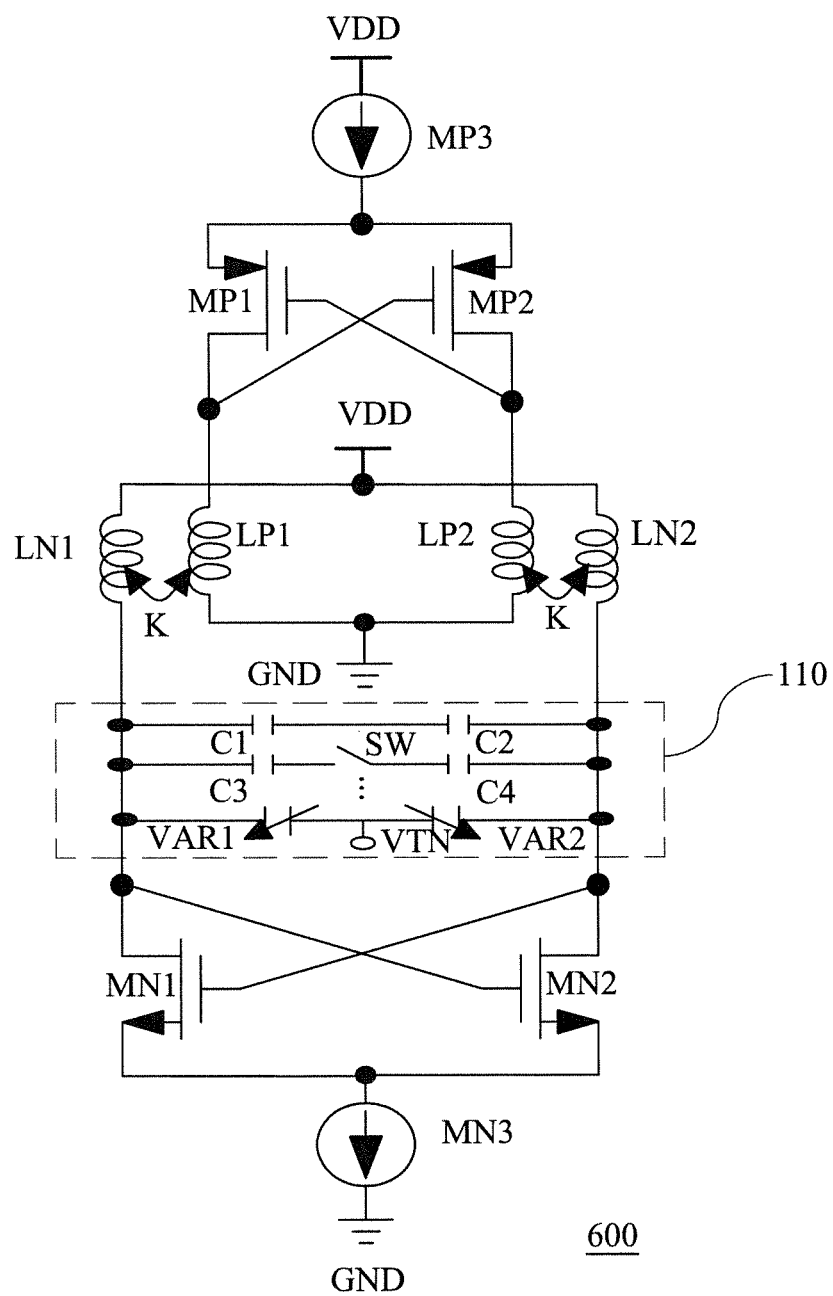
FIG. 6 is a schematic diagram of a CMOS VCO in accordance with some yet other embodiments of the present disclosure.

FIG. 6 is a schematic diagram of a CMOS VCO 600 in accordance with some yet other embodiments of the present disclosure.

Compared with the CMOS VCO 100 in FIG. 1, the CMOS VCO 600 includes the current source MP3 illustrated in FIG. 5, and the inductors LP1 and LP2 are coupled to the ground GND. For this illustration, the current sources MP3 and MN3 provide the corresponding constant currents in the CMOS VCO 600. The current source MP3 provides the DC currents flowing through the transistors MP1 and MP2 and the inductors LP1 and LP2. The current source MN3 provides the DC currents flowing through the inductors LN1 and LN2 and the transistors MN1 and MN2.

Figure 7:
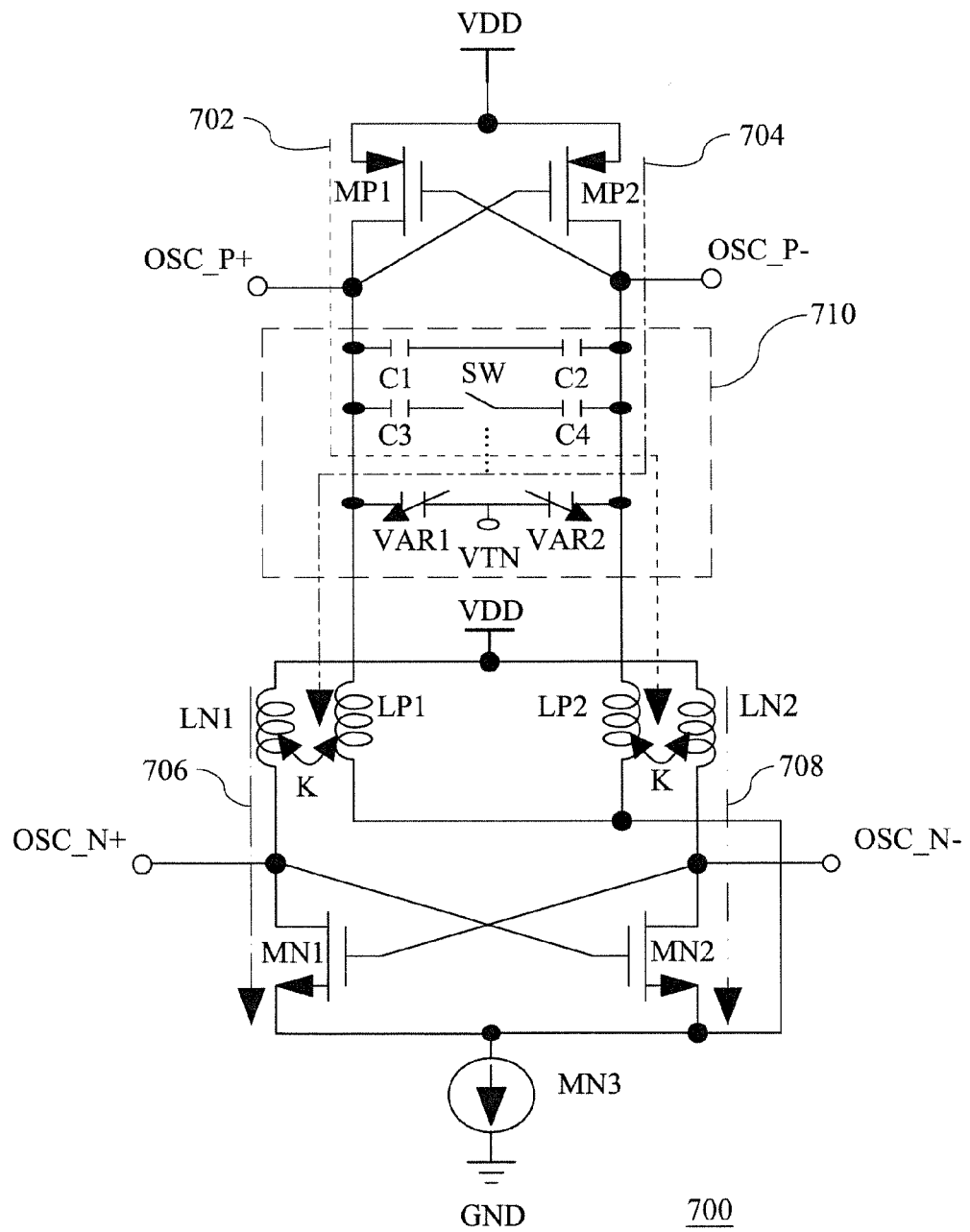
FIG. 7 is a schematic diagram of a CMOS VCO in accordance with alternative embodiments of the present disclosure.

FIG. 7 is a schematic diagram of a CMOS VCO 700 in accordance with alternative embodiments of the present disclosure.

Compared with the CMOS VCO 100 in FIG. 1, the CMOS VCO 700 does not include the capacitance unit 110, but includes the capacitance unit 710 coupled to the output nodes OSC_P+ and OSC_P−. In some embodiments, the capacitance unit 710 is similar to the capacitance unit 110 illustrated in FIG. 1.

The capacitance unit 710 together with the inductors LP1, LP2, LN1 and LN2 operates as an LC resonator. This LC resonator is configured to work in the PMOS cross-coupled VCO. The tuning of the LC resonator is performed by tuning the capacitance of the capacitance unit 710.

In the DC operation of the CMOS VCO 700, the CMOS VCO 700 has DC current paths similar to those of the CMOS VCO 100 in FIG. 2, because the capacitance unit 110 and the capacitance unit 710 have no DC current flowing therethrough.

In the RF operation of the CMOS VCO 700, the RF current flows from MP1 through the capacitance unit 710 to LP2 on an RF current path 702, and an induced RF current then flows from LN2 through MN2 to MN3 on an RF current path 708. Similarly, an RF current flows from MP2 through the capacitance unit 710 to LP1 on an RF current path 704, and an induced RF current then flows from LN1 through MN1 to MN3 on an RF current path 706.

In some embodiments, similar to FIG. 4, the CMOS VCO 700 includes no current source MN3, and thus operates without the constant current provided by the current source MN3.

In some other embodiments, similar to FIG. 5, the CMOS VCO 700 includes the current source MP3 without the current source MN3, and thus operates with the constant current provided by the current source MP3.

In further embodiments, similar to FIG. 6, the CMOS VCO 700 includes the current sources MP3 and MN3, and thus operates with the constant currents provided by the current sources MP3 and MN3.

Figure 8:
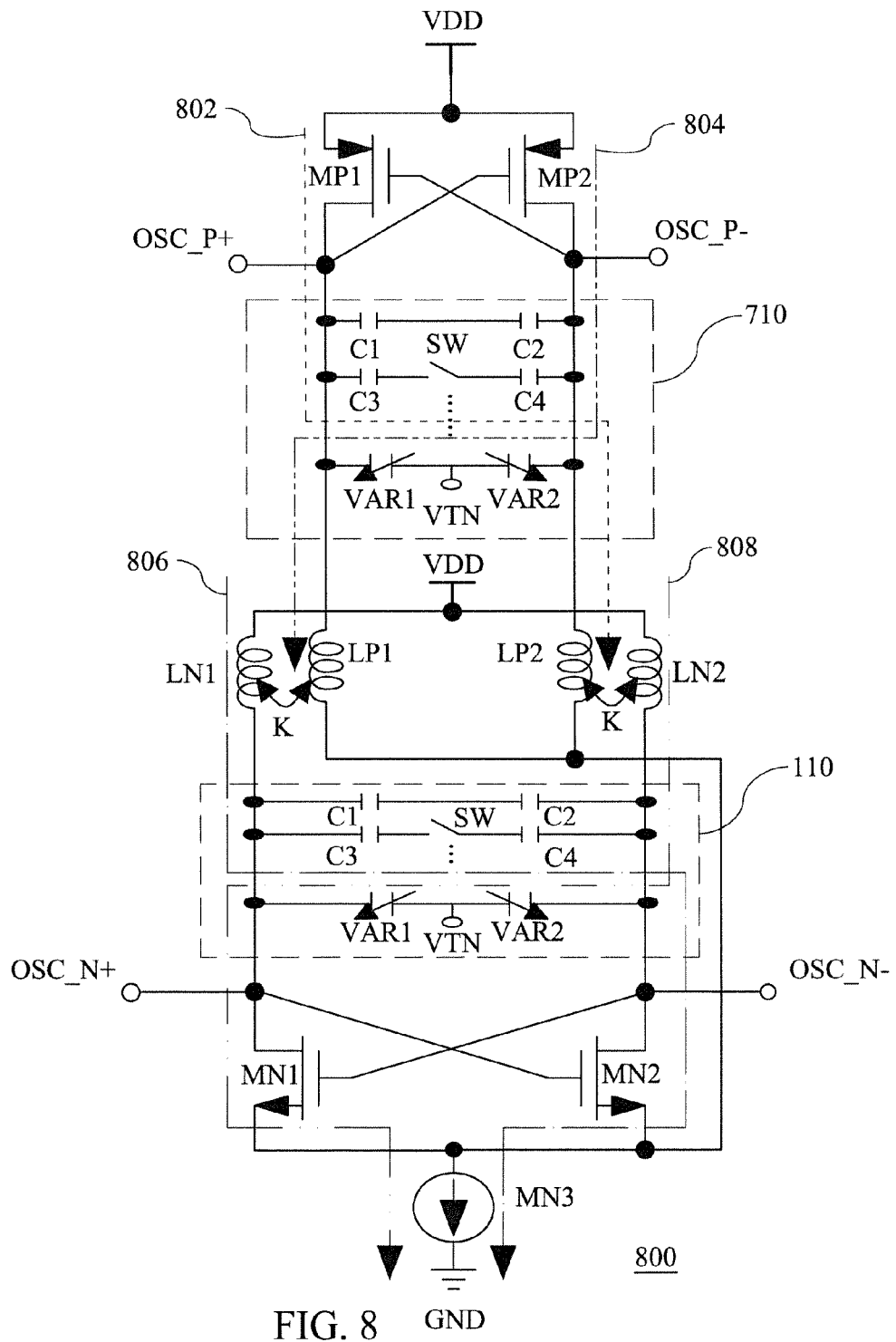
FIG. 8 is a schematic diagram of a CMOS VCO in accordance with further embodiments of the present disclosure.

FIG. 8 is a schematic diagram of a CMOS VCO 800 in accordance with further embodiments of the present disclosure.

Compared with the CMOS VCO 100 in FIG. 1, the CMOS VCO 800 includes the capacitance unit 710 in FIG. 7. Compared with the CMOS VCO 700 in FIG. 7, the CMOS VCO 800 includes the capacitance unit 110 in FIG. 1. Effectively, the CMOS VCO 800 uses the capacitive features of both the capacitance units 110 and 710.

In the DC operation of the CMOS VCO 800, the CMOS VCO 800 has DC current paths similar to those of the CMOS VCO 100 in FIG. 2, because the capacitance units 110 and 710 have no DC current flowing therethrough.

In the RF operation of the CMOS VCO 800, the RF current flows from MP1 through the capacitance unit 710 to LP2 on an RF current path 802, and an induced RF current then flows from LN2 through the capacitance unit 110 and MN1 to MN3 on an RF current path 808. Similarly, an RF current flows from MP2 through the capacitance unit 710 to LP1 on an RF current path 804, and an induced RF current then flows from LN1 through the capacitance unit 110 and MN2 to MN3 on an RF current path 806.

The capacitance unit 110 together with the inductors LP1, LP2, LN1 and LN2 operate as an LC resonator, which, for illustration, is called LCR1 (not labeled). Similarly, the capacitance unit 710 together with the inductors LP1, LP2, LN1 and LN2 operate as another LC resonator, which, for illustration, is called LCR2 (not labeled). The two individual LC resonators LCR1 and LCR2 are each configured to work in the corresponding NMOS cross-coupled VCO and the PMOS cross-coupled VCO. Therefore, the two individual LC resonators LCR1 and LCR2 each can be tuned separately. Further, tuning the LC resonator LCR1 is similar to that illustrated in FIG. 1, and tuning the LC resonator LCR2 is similar to that illustrated in FIG. 7. As a result, in some embodiments, a wider oscillation frequency of the signals at the output nodes OSC_P+, OSC_N+, OSC_P− and OSC_N− are tuned and obtained.

In some embodiments, similar to FIG. 4, the CMOS VCO 800 includes no current source MN3, and thus operates without the constant current provided by the current source MN3.

In some other embodiments, similar to FIG. 5, the CMOS VCO 800 includes the current source MP3 without the current source MN3, and thus operates with the constant current provided by the current source MP3.

In further embodiments, similar to FIG. 6, the CMOS VCO 800 includes the current sources MP3 and MN3, and thus operates with the constant currents provided by the current sources MP3 and MN3.

Based on the aforementioned embodiments in FIG. 3A, in the DC operation, the voltage headroom of the CMOS VCOs is reduced to include a sum of the threshold voltage of the corresponding NMOS or PMOS transistor and the saturation voltage of the corresponding current source MN3 or MP3. As a result, in some embodiments, the CMOS VCOs operate with a power supply voltage VDD of 1 V or less. Moreover, in the RF operation, the CMOS VCOs have reduced phase noise.

The methods in FIG. 2B and FIG. 3B are contemplated to include various operations corresponding to the CMOS VCOs in FIGS. 4-8. The methods shown in FIG. 2B and FIG. 3B are for illustrative purposes. The various operations corresponding to the CMOS VCOs in FIGS. 4-8 are within contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In the descriptions and claims, except for the term "magnetically coupled", the term "coupled" may also be termed as "electrically coupled", and the term "connected" may be termed as "electrically connected". "Coupled" and "connected" may also be used to indicate that two or more elements cooperate or interact with each other.

In some embodiments, an apparatus is disclosed that includes a first cross-coupled transistor pair, a second cross-coupled transistor pair, at least one capacitance unit, and an inductive unit. The first cross-coupled transistor pair is coupled to a pair of first output nodes. The second cross-coupled transistor pair is coupled to a pair of second output nodes. The at least one capacitance unit is coupled to at least one of the pair of first output nodes and the pair of second output nodes. The inductive unit is coupled to the first cross-coupled transistor pair at the first output nodes and coupled to the second cross-coupled transistor pair at the second output nodes. The inductive unit is configured to generate mutual magnetic coupling between one of the first output nodes and one of the second output nodes and between the other of the first output nodes and the other of the second output nodes.

Also disclosed is an apparatus including a first transistor, a second transistor, a third transistor, a fourth transistor, a capacitance unit, a first inductive unit, and a second inductive unit. Drains of the first and second transistors are coupled to a pair of first output nodes. A gate of the first transistor is coupled to the drain of the second transistor. A gate of the second transistor is coupled to the drain of the first transistor. Drains of the third and fourth transistors are coupled to a pair of second output nodes. A gate of the third transistor is coupled to the drain of the fourth transistor. A gate of the fourth transistor is coupled to the drain of the third transistor. The capacitance unit is coupled to at least one of the pair of first output nodes and the pair of second output nodes. The first inductive unit is configured to magnetically couple one of the first output nodes to one of the second output nodes. The second inductive unit is configured to magnetically couple the other of the first output nodes to the other of the second output nodes.

A method is also disclosed in which a first inductive element is magnetically coupled to a second inductive element, a third inductive element is magnetically coupled to a fourth inductive element, and signals having oscillation frequency are generated at a pair of first output nodes and at the pair of second output nodes. The first and third inductive elements are electrically coupled to a first cross-coupled transistor pair at the pair of first output nodes. The second and fourth inductive elements are electrically coupled to a second cross-coupled transistor pair at the pair of second output nodes.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. An apparatus, comprising:
   a first cross-coupled transistor pair electrically coupled to a pair of first output nodes;
   a second cross-coupled transistor pair electrically coupled to a pair of second output nodes;
   at least one capacitance unit electrically coupled to at least one pair of the pair of first output nodes and the pair of second output nodes; and
   a first inductive element electrically coupled to one of the first output nodes;
   a second inductive element electrically coupled to the other of the first output nodes;
   a third inductive element electrically coupled to one of the second output nodes, the third inductive element configured to be DC-biased and magnetically coupled to the first inductive element; and
   a fourth inductive element electrically coupled to the other of the second output nodes, the fourth inductive element configured to be DC-biased and magnetically coupled to the second inductive element.

2. The apparatus of claim 1, wherein a coupling coefficient between the first and third inductive elements is the same as a coupling coefficient between the second and fourth inductive elements.

3. The apparatus of claim 1, wherein in a DC operation, the first and third inductive elements are decoupled from each other, and the second and fourth inductive elements are decoupled from each other.

4. The apparatus of claim 3, wherein in an RF operation, the first and third inductive elements are magnetically coupled to each other, and the second and fourth inductive elements are magnetically coupled to each other.

5. The apparatus of claim 1, wherein the capacitance unit comprises:
   a variable capacitance bank.

6. The apparatus of claim 1, wherein the capacitance unit comprises:
   a variable capacitance bank configured for coarse frequency tuning; and
   a variable capacitive element configured for fine frequency tuning.

7. The apparatus of claim 1, further comprising:
   a current source electrically coupled to the first cross-coupled transistor pair or the second cross-coupled transistor pair.

8. The apparatus of claim 1, further comprising:
   a first current source electrically coupled to the first cross-coupled transistor pair; and
   a second current source electrically coupled to the second cross-coupled transistor pair.

9. An apparatus, comprising:
   a first transistor and a second transistor, first terminals of the first and second transistors electrically coupled to a pair of first output nodes, a control terminal of the first transistor electrically coupled to the first terminal of the second transistor, a control terminal of the second transistor electrically coupled to the first terminal of the first transistor;
   a third transistor and a fourth transistor, first terminals of the third and fourth transistors electrically coupled to a pair of second output nodes, a control terminal of the third transistor electrically coupled to the first terminal of the fourth transistor, a control terminal of the fourth transistor electrically coupled to the first terminal of the third transistor;
   a capacitance unit electrically coupled to at least one pair of the pair of first output nodes and the pair of second output nodes;
   a first inductive unit configured to magnetically couple one of the first output nodes to one of the second output nodes; and
   a second inductive unit configured to magnetically couple the other of the first output nodes to the other of the second output nodes;
   wherein the first inductive unit comprises:
      a first inductive element electrically coupled to one of the second output nodes, the first inductive element configured to be DC-biased;
   wherein the second inductive unit comprises:
      a second inductive element electrically coupled to the other of the second output nodes, the second inductive element configured to be DC-biased.

10. The apparatus of claim 9, wherein the first inductive unit further comprises:
    a third inductive element electrically coupled to one of the first output nodes; and
    wherein the first and third inductive elements are configured to have mutual magnetic coupling therebetween.

11. The apparatus of claim 10, wherein the second inductive unit further comprises:
    a fourth inductive element electrically coupled to the other of the first output nodes; and
    wherein the second and fourth inductive elements are configured to have mutual magnetic coupling therebetween.

12. The apparatus of claim 9, wherein the capacitance unit comprises:
    a capacitive element having a first terminal and a second terminal, the first terminal of the capacitive element being electrically coupled to one of the first output nodes; and
    a switch having a first terminal and a second terminal, the first terminal of the switch being electrically coupled to the second terminal of the capacitive element, the second terminal of the switch being electrically coupled to the other node of the first output nodes.

13. The apparatus of claim 9, wherein the capacitance unit comprises:
    at least one analog-voltage controlled variable capacitive element electrically coupled between the first output nodes.

14. The apparatus of claim 9, wherein the capacitance unit comprises:

a capacitive element having a first terminal and a second terminal, the first terminal of the capacitive element being electrically coupled to one of the second output nodes; and a switch having a first terminal and a second terminal, the first terminal of the switch being electrically coupled to the second terminal of the capacitive element, the second terminal of the switch being electrically coupled to the other node of the second output nodes.

15. The apparatus of claim 9, wherein the capacitance unit comprises:

at least one analog-voltage controlled variable capacitive element electrically coupled between the second output nodes.

16. A method comprising:

DC-biasing a first inductive element which is magnetically coupled to a second inductive element;

DC-biasing a third inductive element which is magnetically coupled to a fourth inductive element;

wherein the second and fourth inductive elements are electrically coupled to a first cross-coupled transistor pair at a pair of first output nodes, and the first and third inductive elements are electrically coupled to a second cross-coupled transistor pair at a pair of second output nodes;

generating signals having oscillation frequency at the pair of first output nodes and at the pair of second output nodes.

17. The method of claim 16, further comprising:

controlling the oscillation frequency of the signals at the pair of first output nodes and at the pair of second output nodes by configuring a capacitance unit;

wherein the capacitance unit is electrically coupled to at least one pair of the pair of first output nodes and the pair of second output nodes.

18. The method of claim 16, further comprising:

tuning a coarse oscillation frequency of the signals at the pair of first output nodes and at the pair of second output nodes by configuring a variable capacitance bank;

wherein the variable capacitance bank is electrically coupled to at least one pair of the pair of first output nodes and the pair of second output nodes.

19. The method of claim 16, further comprising:

tuning a fine oscillation frequency of the signals at the pair of first output nodes and at the pair of second output nodes by configuring a variable capacitive element;

wherein the variable capacitive element is electrically coupled to at least one pair of the pair of first output nodes and the pair of second output nodes.

20. The method of claim 16, further comprising:

in a DC operation, decoupling the first inductive element from the second inductive element, and decoupling the third inductive element from the fourth inductive element.

* * * * *